United States Patent [19]
Kuttner

[11] Patent Number: 5,825,316
[45] Date of Patent: Oct. 20, 1998

[54] METHOD FOR THE SELF-CALIBRATION OF AN A/D OR D/A CONVERTER IN WHICH THE WEIGHTED REFERENCES OF THE AT LEAST ONE MAIN NETWORK ARE PARTIALLY CALIBRATED ONCE PER CALIBRATION CYCLE

[75] Inventor: Franz Kuttner, St. Ulrich, Austria

[73] Assignee: Siemens Aktiengesellschaft, Munich, Germany

[21] Appl. No.: 627,968

[22] Filed: Apr. 4, 1996

[30] Foreign Application Priority Data

Apr. 4, 1995 [DE] Germany .................. 195 12 495.2

[51] Int. Cl.⁶ .................................................. H03M 1/10
[52] U.S. Cl. .............................................. 341/120; 341/172
[58] Field of Search ..................................... 341/118, 120, 341/150, 172

[56] References Cited

U.S. PATENT DOCUMENTS 4,399,426  8/1983  Tan .
4,709,225  11/1987  Welland .................................. 341/120

FOREIGN PATENT DOCUMENTS 0 064 147  11/1982  European Pat. Off. .
2 184 621  6/1987  United Kingdom .

OTHER PUBLICATIONS

IEEE Publ. vol.30, No.3, Mar. 1983, pp. 188–190, (Lee et al.), "Circuits and Systems Letters".

Primary Examiner—Howard L. Williams
Attorney, Agent, or Firm—Herbert L. Lerner; Laurence A. Greenberg

[57] ABSTRACT

A method for self-calibration of an analog/digital converter or of a digital/analog converter is performed in a converter including at least one main network with weighted reference elements and one correction network being coupled with the main network for error correction and having weighted further reference elements. The method includes self-calibrating a portion of the reference elements of the main network between two conversions and ascertaining a correction value associated with the portion of the reference elements.

10 Claims, 1 Drawing Sheet

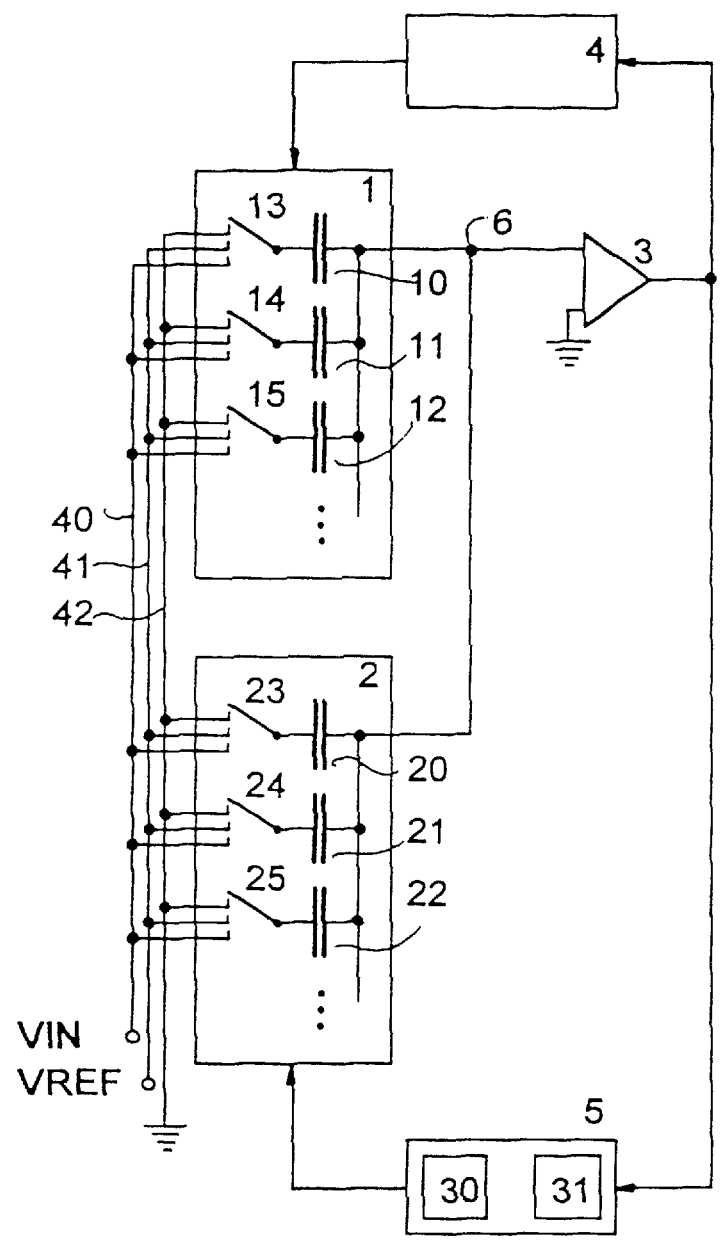

(12) United States Patent

METHOD FOR THE SELF-CALIBRATION OF AN A/D OR D/A CONVERTER IN WHICH THE WEIGHTED REFERENCES OF THE AT LEAST ONE MAIN NETWORK ARE PARTIALLY CALIBRATED ONCE PER CALIBRATION CYCLE

BACKGROUND OF THE INVENTION

FIELD OF THE INVENTION

The invention relates to a method for self-calibration of an analog/digital converter or a digital/analog converter, in which the converter includes at least one main network with weighted reference elements and one correction network which is coupled with the main network for error correction and has weighted further reference elements.

In A/D converters or D/A converters, reference elements are used in order to derive reference signals as a function of an input signal to be converted. A conversion to the digital or analog output signal is carried out in comparison operations with the reference signals. Those reference elements form a weighted network. The reference elements are constructed, for example, as resistors, capacitors or transistors. The ratio to one another of the reference variables generated by the weighted reference elements affects the accuracy of the converter.

Self-calibration methods are used in order to improve production-dictated imprecision of the weighting ratios of the reference elements. A self-calibration method that is suitable for A/D converters which operate by the principle of successive operation with charge redistribution in a weighted capacitor network is described in a publication entitled "Self-Calibration Technique for A/D Converters", by H. S. Lee and D. A. Hodges, in IEEE Transactions on Circuits and Systems, Vol. CAS-30, No. 3, March 1983, pp. 188–190. A similar method is described in U.S. Pat. No. 4,399,426 to Tan. In that self-calibration method, a correction capacitor network is provided along with the main capacitor network intended for the conversion, by which errors in linearity of the main capacitor network are corrected. The correction network is assigned a memory which contains the correction values by which the correction capacitors are triggered, so that linearity errors are compensated for as much as possible. The correction values are ascertained by the self-calibration method. In that self-calibration, the capacitance of a reference element of the main network is compared with a sum of capacitances of lower-significance reference elements. That is carried out by charge redistribution from the reference element to the respectively lower-significance reference elements and evaluation of the change in voltage. In that way, for each reference element, the deviation from an ideal weighting is ascertained in increments, and a correction value for each reference element is ascertained therefrom. The calibration is entirely carried out during a single self-calibration cycle, so that the correction values for the succeeding conversion operations are used unchanged. In the Lee and Hodges publication it is proposed that the self-calibration be expediently performed after turn-on during the power-on.

Such converters with self-calibration can be constructed together with other, preferably time-discrete and digital, circuit devices on a single integrated semiconductor chip. For example, such chips may be microcontrollers, which include a digital clock-controlled processor to which analog signals can be supplied through an A/D converter interface. That is true, for instance, for the Siemens SAB 80C166 integrated circuit. The clock-controlled operation of the processor means that interference pulses can occur on signal and supply voltage lines. The interference is superimposed on the output signal generated by the A/D converter, to produce uncorrelated noise that is stochastically distributed or a signal offset that contains the interference occurring in synchronism with the sampling rate of the converter. The results of measurement in the self-calibration operation are also affected by that interference. The accuracy of the calibration can be reduced thereby. In particularly situated cases, such interference can even mean that the correction produced by the calibration has a positive feedback effect, so that correction is performed in the wrong direction, thus considerably reducing the accuracy of the converter.

SUMMARY OF THE INVENTION

It is accordingly an object of the invention to provide a method for self-calibration of an analog/digital converter or a digital/analog, which overcomes the hereinaforementioned disadvantages of the heretofore-known methods of this general type and which is less vulnerable to interference.

With the foregoing and other objects in view there is provided, in accordance with the invention, a method for self-calibration of an analog/digital converter or of a digital/analog converter having at least one main network with weighted reference elements and one correction network being coupled with the main network for error correction and having weighted further reference elements, which comprises self-calibrating a portion of the reference elements of the main network between two conversions, and ascertaining a correction value associated with the portion of the reference elements.

In accordance with another mode of the invention, there is provided a method which comprises carrying out the step of ascertaining the correction value associated with a reference element of a network, by once-varying a correction value already present for the reference element by a fixed increment width upon each self-calibration operation.

In accordance with a further mode of the invention, there is provided a method which comprises performing an offset calibration operation in which an already present correction value for the offset calibration is varied once, only by a fixed increment width, after a succession of self-calibration operations for the reference elements of the main network.

In accordance with an added mode of the invention, there is provided a method which comprises setting the fixed increment width at 1 LSB, wherein 1 LSB is the least-significant bit of the respective correction value.

In accordance with an additional mode of the invention, there is provided a method which comprises initially preoccupying the correction values by zero, then setting the fixed increment width to be greater than 1 LSB for a number of calibration operations, and subsequently setting the increment width at 1 LSB, wherein 1 LSB is the least-significant bit of the respective correction value.

In accordance with yet another mode of the invention, there is provided a method which comprises carrying out a self-calibration operation by comparing a characteristic signal derived from a reference element with a signal formed from reference elements of lower weighting, while taking into account the correction network controlled by the correction value for the reference element, and varying the correction value by the fixed increment width as a function of the outcome of the comparison.

In accordance with yet a further mode of the invention, there is provided a method which comprises carrying out an offset calibration operation, by comparing a signal derived from the correction value provided for the offset calibration with a signal derived from an instantaneously present offset, and varying the correction value by the fixed increment width as a function of the outcome of the conversion.

In accordance with a concomitant mode of the invention, there is provided a method which comprises operating a converter having a binary-weighted main capacitor network and a binary-weighted correction capacitor network by the principle of charge redistribution with successive approximation.

Due to the method according to the invention, the self-calibration is relatively invulnerable to interference that occurs during the calibration operation and that can, for instance, be produced by clock-controlled circuit units. The method is especially suitable for a converter that is disposed together with other circuit units on an integrated circuit chip. The method step of self-calibration to be carried out during two conversions requires only a brief time, so that for a user of the converter, the calibration takes place unnoticed, in the background. The availability of the converter is hardly impaired thereby, and the speed of conversion is unaffected. In an embodiment of the method of the invention, both randomly occurring interference and synchronous interference (offset) are satisfactorily corrected. In the known self-calibration method for A/D converters with charge redistribution and successive approximation, the method of the invention can be realized without additional hardware expense, merely by modifying the control.

Other features which are considered as characteristic for the invention are set forth in the appended claims.

Although the invention is illustrated and described herein as embodied in a method for self-calibration of an A/D or a D/A converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure of the drawing is a schematic and block circuit diagram of an example of an A/D converter which operates by the principle of charge redistribution and successive approximation.

DESCRIPTION OF THE PREFERRED EMBODIMENTS

Referring now in detail to the single figure of the drawing, there is seen an A/D converter which includes a main capacitor network 1 and a correction network 2. The two networks are coupled to one another on the output side at a node 6. A signal which is present at the node 6 is compared with a reference voltage at a comparator 3, and a control device 4 for the main capacitor network 1 or a control device 5 for the correction network 2 is triggered as a function of the comparison.

The main capacitor network 1 includes many binary weighted capacitors, of which only the most-significant capacitors 10, 11, 12 are shown. The weighted capacitors can be connected either to ground potential, to a reference potential VREF, or to an input signal VIN, through respective switches 13, 14, 15. Control of the switches and evaluation of the voltage signal at the node 6, which is dependent thereon, is carried out by the control device 4. A conversion of the analog input signal VIN to a digital output signal, which is present in the device 4, is carried out according to the principle of charge redistribution and successive approximation, as is described in the aforementioned U.S. Patent to Tan. To that end, the capacitors of the weighted network 1 are first charged with the input signal VIN, while the node 6 is grounded (sampling of the input signal VIN). Next, each of the switches 13, 14, 15 is connected successively to both the reference potential VREF and ground potential. Depending on the outcome of the comparison in the comparator 3, the resultant digital value is stored in memory in a register of the control device 4.

A memory device 30, which is provided in the control device 5, contains one correction value for each of the reference elements 10, 11, 12. This correction value assures that whenever one of the capacitors 10, 11, 12 of the main network 1 is activated for a comparison operation for the purpose of the successive approximation, a correction signal generated by the correction network 2 is fed to the node 6, so that an error of the particular capacitor of the network 1 is compensated for. Requisite switch settings for switches 23, 24, 25 of the correction network 2 are defined by the correction value stored in the memory 30 of the control device 5. To this extent, the mode of operation of the A/D converter shown in the drawing is equivalent to the descriptions in the aforementioned Tan and Lee/Hodges references.

The invention assumes that correction values for each of the reference elements 10, 11, 12 are already stored in the correction memory 30. These values may have been ascertained by a calibration operation during the turn-on phase. A self-calibration operation is carried out according to the invention between successive conversion operations for two sampling values of the input signal VIN. In that operation, in the case of only one of the reference elements 10, 11, 12, the correction value already available for this reference element is either raised or lowered by a predetermined increment width, as a function of the outcome of the comparison in the comparator 3. Expediently, this increment width is +/−1 LSB (LSB means the Least Significant Bit of the correction value). After a succeeding conversion, a further such self-calibration operation is carried out. In it, the self-calibration operation is applied to another of the reference elements 10, 11, 12, suitably the next lower-weighted or higher-weighted reference element. Once again, its already available correction value is varied by +/−1 LSB as a function of the outcome in the comparator 3. In the case of a network having n reference elements 10, 11, 12, the correction value is accordingly adjusted after every $n^{th}$ conversion. A corresponding timing is carried out by a control portion 31 of the control device 5.

If interference arises in a calibration between two conversions, the outcome of the comparison in the comparator 3 is affected and possibly made wrong. Consequently, the associated correction value is varied by +/−1 LSB in the wrong direction. However, experience in practical cases has shown that by the next transit after n conversions, this interference, if it arose at random and is distributed as uniformly as possible stochastically, will have faded. Then the correction value is varied in the correct direction again. In the case of random interference, this self-calibration method consequently results in the correction values fluctuating around their command correction value, and despite the interference in the environment, the calibration error remains sufficiently slight.

In principle, the following self-calibration steps are carried out for each of the reference elements between two conversion operations. The main capacitor network of the converter is adjusted in such a way that the reference capacitor to be calibrated is applied to one reference voltage, while the lower-significance reference capacitors are applied to the other reference voltage. The correction network is activated and takes the already existing correction value into account. Next, the reference voltages at the capacitors are reversed. Depending on the outcome in the comparator 3, the correction value is then varied by +/−1 LSB. These method steps are repeated between two further successive conversions, each time calibrating a different reference element.

While as described above random interference in the form of noise affects the linearity of the main correction network, interference that occurs synchronously with the sampling rate of the converter causes an offset of the digitally converted output outcome of the converter. In order to compensate for synchronous interference, an additional calibration operation is carried out, after which all of the reference elements will have been individually compensated for in terms of linearity as described above. Only this offset interference is ascertained and compensated for in the offset calibration.

The offset is composed of a static portion, resulting from the comparator, and synchronous interference superimposed on the signals of the converter. This synchronous interference may, for instance, be voltage and current pulses over supply and signal lines, caused by the synchronous, clock-controlled switching of digital circuit devices that are constructed together with the A/D converter on an integrated circuit. In the offset calibration, the offset is compared with a correction value that is already present in the memory 30, and the correction value is then raised or lowered by +/−1 LSB. Thus the correction value for the offset fluctuates about the command correction value. Moreover, the offset of a slow change which is caused, for instance, by temperature changes, can be tracked.

Only the interference caused by the offset is ascertained. in the offset calibration. To that end, a conversion is expediently carried out with the already existing offset correction value. If the existing correction value is correct and exactly compensates for the offset, then the comparator 3 is located precisely at its decision threshold. Accordingly, the comparator assumes one of its two outset states, with identical probability. Depending on this outcome of the comparator, the correction value is then varied by +/−1 LSB. The correction value then fluctuates closely about the command correction value. If the correction value deviates from the actually present offset value to a greater extent, then depending on the direction of the deviation, readjustment by +/−1 LSB is repeatedly performed (only one readjustment operation of +/−1 LSB occurs between two conversions), so that the correction command value is reached and the offset is precisely compensated for after a plurality of offset self-calibration operations. If the correction value includes an eight-bit word width, for instance, and thus a calibration range of +/−128, then the command correction value in the least favorable case will be attained after 128 transits.

Due to the incremental variation by +/−1 LSB for the correction value of the offset calibration, and due to the correction values of the linearity calibration, a low-pass property of the calibration is achieved for the reference elements. Brief interfering factors have hardly any effect. Noise is accordingly filtered out during the calibration.

When the A/D converter is turned on or upon a reset, all of the correction values in the memory 30 are expediently preoccupied by a zero. In the case of an ensuing number of self-calibration operations, an increased increment width of +/−15 LSB, for instance, will then be provided. In the case of an ensuing number of self-calibration operations, a somewhat decreased increment width of, for instance +/−7 LSB, will be provided, and then for yet another further number of self-calibration operations an increment width of +/−3 LSB. It is not until then that the increment width of +/−1 LSB is used, as described above, for each calibration operation. As a result, it is attained that upon turn-on or upon a reset, the steady state of the command correction values is reached relatively quickly. However, the initial conversions are then carried out with reduced accuracy.

I claim:

1. A method for self-calibration of an analog/digital converter or of a digital/analog converter having at least one main network with a plurality of weighted reference elements and one correction network being coupled with the main network for error correction and having weighted further reference elements, which comprises:

partitioning the plurality of weighted reference elements into a plurality of subsets of reference elements;

sequentially performing the following steps upon each of the subsets;

selecting a subset not yet having been selected within the step of sequentially performing;

self-calibrating the selected subset of reference elements between two conversions;

ascertaining a single-step correction value associated with the selected subset of reference elements; and carrying out repeatedly the step of sequentially performing.

2. The method according to claim 1, which comprises carrying out the step of ascertaining the correction value associated with a reference element of a network, by once-varying a correction value already present for the reference element by a fixed increment width upon each self-calibration operation.

3. The method according to claim 2, which comprises performing an offset calibration operation in which an already present correction value for the offset calibration is varied once, only by a fixed increment width, after a succession of self-calibration operations for the reference elements of the main network.

4. The method according to claim 2, which comprises setting the fixed increment width at 1 LSB, wherein 1 LSB is the least-significant bit of the respective correction value.

5. The method according to claim 2, which comprises initially preoccupying the correction values by zero, then setting the fixed increment width to be greater than 1 LSB for a number of calibration operations, and subsequently setting the increment width at 1 LSB, wherein 1 LSB is the least-significant bit of the respective correction value.

6. The method according to claim 2, which comprises carrying out a self-calibration operation by comparing a characteristic signal derived from a reference element with a signal formed from reference elements of lower weighting, while taking into account the correction network controlled by the correction value for the reference element, and varying the correction value by the fixed increment width as a function of the outcome of the comparison.

7. The method according to claim 3, which comprises carrying out an offset calibration operation, by comparing a signal derived from the correction value provided for the offset calibration with a signal derived from an instantaneously present offset, and varying the correction value by the fixed increment width as a function of the outcome of the conversion.

8. The method according to claim 1, which comprises operating a converter having a binary-weighted main capacitor network and a binary-weighted correction capacitor network by the principle of charge redistribution with successive approximation.

9. A method for self-calibration of an analog/digital converter or of a digital/analog converter having at least one main network with n weighted reference elements and one correction network being coupled with the main network for error correction and having m weighted trim elements, which comprises:
   a) performing a self-calibrating step on one of the n reference elements between two conversions;
   b) determining a correction value associated with the one reference element;
   c) sequentially repeating the self-calibrating and determining steps on further reference elements of the n reference elements until the calibration process is completed once for each of the n reference elements; and
   d) carrying out the steps of a, b and c to perform further calibration steps on each of the n reference elements once every nth calibration step.

10. A method for self-calibrating of an analog/digital converter or of a digital/analog converter having at least one main network having n reference elements and one correction network being coupled to said main network for error correction and having weighted further reference elements, comprising the steps of:
   sequentially performing the following steps upon each of the n reference elements:
      selecting a reference element not yet having been selected within the step of sequentially performing;
      self-calibrating the selected reference element between two conversions;
      ascertaining a single-step correction value associated with the selected reference element; and
   carrying out repeatedly the step of sequentially performing.

* * * * *